(12) United States Patent
Morita

(10) Patent No.: US 6,339,471 B1
(45) Date of Patent: Jan. 15, 2002

(54) PROJECTION EXPOSURE APPARATUS

(75) Inventor: Masahiro Morita, Chiba-ken (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/427,022

(22) Filed: Oct. 26, 1999

Related U.S. Application Data

(63) Continuation of application No. 08/917,808, filed on Aug. 27, 1997.

Foreign Application Priority Data

Aug. 27, 1996 (JP) .............................................. 8-225268

(51) Int. Cl.⁷ .............................................. G01B 11/00
(52) U.S. Cl. ........................ 356/401; 356/399; 356/401; 250/492.2
(58) Field of Search ................................. 356/399, 400, 356/401, 363; 355/53, 67, 69, 54; 250/492.2

(56) References Cited

U.S. PATENT DOCUMENTS

| | | | |
|---|---|---|---|
| 4,272,193 A | * 6/1981 | Eastman et al. ............ | 356/349 |
| 4,819,033 A | 4/1989 | Yoshitake et al. | |
| 4,947,047 A | 8/1990 | Muraki | |
| 5,638,168 A | * 6/1997 | Kubota et al. ........... | 356/124.5 |
| 5,689,339 A | * 11/1997 | Ota et al. .................... | 356/401 |
| 5,734,478 A | * 3/1998 | Magome et al. ............ | 356/401 |

\* cited by examiner

Primary Examiner—Frank G. Font
Assistant Examiner—Roy M. Punnoose
(74) Attorney, Agent, or Firm—Nixon & Vanderhye P.C.

(57) ABSTRACT

A projection exposure apparatus has an alignment system in which the coherence length of the laser light is controlled. The alignment system uses a laser beam having a short coherence length, such as a multi-mode laser beam, as alignment light. In this arrangement, detection signals supplied from the alignment system are stabilized because undesired interference on the mask or the photosensitive substrate and adverse effects due to the returning light or temperature changes or other changes in the laser light source are reduced. If a semiconductor laser is used as the laser light source, a high-speed switching circuit for switching the laser oscillation at a high speed is provided to the semiconductor laser driving circuit so as to emit the laser light in the multiple oscillation modes.

29 Claims, 10 Drawing Sheets

PROJECTION EXPOSURE APPARATUS

This is a continuation of application Ser. No. 08/917,808, filed Aug. 27, 1997, now pending, the entire content of which is hereby incorporated by reference in this application.

BACKGROUND OF THE INVENTION

This invention relates to a projection exposure apparatus that exposes a pattern formed on a mask to transfer the pattern onto a photosensitive substrate.

In a manufacturing process for semiconductor devices or liquid crystal display devices, a projection exposure apparatus is conventionally used to illuminate a pattern formed on a photomask (or a reticle) with an illumination light and project an image of the pattern onto a photosensitive substrate. Typically, a semiconductor wafer or a glass plate coated with photosensitizer (e.g., photoresist) is used as the photosensitive substrate.

Currently, a step-and-repeat type projection exposure apparatus is widely used. With a step-and-repeat type projection exposure apparatus, a photosensitive substrate is loaded on a substrate stage, which is movable in two dimensions, and the shot areas arranged on the photosensitive substrates are successively exposed into the pattern image of the mask by shifting the photosensitive substrate in a stepwise manner by moving the substrate stage. A scanning-type projection exposure apparatus is also widely used, in which both the mask and the photosensitive substrate are scanned synchronously, thereby exposing the photosensitive substrate into the pattern image of the mask. Two types of scanning type projection exposure apparatus are known, a step-and-scan type apparatus, in which moving from one shot area to the next shot area is performed in a stepwise manner, and a collective-exposure type apparatus, in which the pattern of a large mask is transferred by scanning onto the entire surface of a single photosensitive substrate.

All of these projection exposure systems require highly accurate alignment in order to precisely superpose a pattern of the mask onto the pattern that has already been formed on the photosensitive substrate. The alignment is generally performed by detecting an alignment mark formed on the mask and/or photosensitive substrate using a detection system installed in the projection exposure apparatus.

U.S. patent application Ser. No. 418,260 (filed on Oct. 6, 1989) now U.S. Pat. No. 5,734,478, discloses an LSA (Laser Step Alignment) system that detects the position of an alignment mark formed by several columns of dots by illuminating laser light onto the dot sequence to obtain the light diffracted or scattered by the alignment mark. An FIA (Field Image Alignment) system uses a halogen lamp as a light source to illuminate the alignment mark with a light beam having a broad waveband width. The FIA system picks up the image of the alignment mark and processes the image data of the alignment mark. An LIA (Laser Interferometric Alignment) system illuminates a diffraction-grid alignment mark with laser beams from two different directions and picks up the interference signal of the diffracted light generated from the alignment mark, thereby detecting the position of the alignment mark. The LIA system includes a homodyne system, which is disclosed in U.S. Pat. No. 4,636,077 and uses two laser beams having the same frequency, and a heterodyne system, which is disclosed in U.S. Pat. No. 5,734,478 and uses two laser beams having slightly different frequencies.

Alignment methods are grouped into a TTL (Through-the-Lens) method, a TTR (Through-the-Reticle) method, and an off-axis method. In the TTL method, the position of the photosensitive substrate is measured through the projection optical system. In the TTR method, the positional relation between the reticle and the photosensitive substrate is detected through the reticle. In the latter case, the reticle is used as both a mask and a projection optical system. In the off-axis method, the position of the photosensitive substrate is directly measured without using the projection optical system.

In the LIA system, an alignment mark formed in the vicinity of the pattern field of the mask and an alignment mark formed in the vicinity of a shot area on the photosensitive substrate are simultaneously measured by the alignment system positioned above the mask to directly detect an offset (displacement) between the two marks. Based on the detected offset, the mask or the photosensitive substrate is finely adjusted so that the amount of the offset (displacement) becomes zero.

According to this method, illumination light whose waveband is insensitive to the photoresist layer is used as alignment light. For example, as shown in FIG. 9, a laser beam emitted by a semiconductor laser LD and having a wavelength of 690 nm is used. Such a semiconductor laser LD is driven by a driving circuit, which includes an auto output control (APC) circuit 52 to output constant level light. The alignment system installed above the mask guides the alignment light projected onto the mask surface and the alignment light projected onto the photosensitive substrate surface along the same axis from the semiconductor laser to an object lens of the alignment system. The alignment light exiting from the object lens illuminates a diffraction-grid alignment mark formed on the mask (hereinafter, referred to as a reticle mark) and a diffraction-grid alignment mark formed on the photosensitive substrate (hereinafter, referred to as a substrate mark). Taking the advantage of the fact that the two alignment light beams are substantially coaxial, the alignment system photoelectrically detects the light information from the reticle and the light information from the substrate at the same time.

FIG. 10 illustrates the relation between a reticle mark RM formed on the mask 1 and the alignment light. The reticle mark RM is usually formed on the bottom surface 1B of the mask 1, which lies on the opposite side of the surface 1A, which receives the incidence light. The alignment light fluxes f1 and f2 coming from two directions are guided onto the reticle mark RM. The light flux f1 is reflected and diffracted by the reticle mark RM formed on the bottom surface 1B of the mask 1. Then, the 0-th order reflected light f1 returns to its normal direction. However, a fraction of the 0-th order diffracted light is internally reflected on the top surface 1A of the mask 1, and then again reflected and diffracted by the reticle mark RM. As a result, the flux f1 becomes multiplexed reflected/diffracted light, and returns in the same direction as the 0-th order diffracted light. (FIG. 10 does not illustrate the light that transmits the bottom surface 1B of the mask 1.) The regularly reflected light of the flux f1, which exists on the top surface 1A of the mask 1, interferes with the multiplexed reflected/diffracted light and the 0-th order diffracted light. Hence, the detection signals generated from the reticle mark RM interfere with each other as they reach the photoelectric detector. The same applies to the light flux f1, but f2 acts from the opposite direction.

In general, laser light used as alignment light is highly coherent, and depending on the kind of semiconductor laser used, the wavelength of the emitted light changes due to a mode hop phenomena, which induces undesirable changes in the interference conditions. As a consequence, the detection signals from the reticle mark are disrupted and the alignment accuracy (reproducibility) worsens.

The mode hop phenomena of a semiconductor laser is considered to be generated by changes in temperature, temporal changes, and the influence of the returning light (the light that is reflected on a plane perpendicular to the optical axis of the optical device comprising the optical system and that returns to the laser light source) and the like. As illustrated in FIG. 11, one or more monochromatic wavelengths $\lambda_1$, $\lambda_2$, $\lambda_3$, . . . generated by signal mode oscillation appears at random in a neighborhood of the central wavelength $\lambda_0$. These different wavelengths make the interference among the 0-th order diffracted light, the regularly reflected light, and the multiplexed reflected light unstable. As a result, the alignment between the mask and the photosensitive substrate becomes inaccurate, which reduces manufacturing yield.

In order to prevent the mode hop phenomenon, a temperature control method, which fixes the temperature of the semiconductor laser within a modestabilization range, is known. This method can temporarily stabilize the mode; however, in the long run, temporal mode hops occur even if the temperature remains constant. Moreover, depending on the condition of the returning light, the mode can become unstable regardless of the temperature. Hence, the temperature control method does not solve the fundamental problem.

The influences of the regularly reflected light, the multiplexed reflected/diffracted light and the 0-th order diffracted light, which arise on the top and bottom surfaces of the mask and reticle mark, has been explained above. Similar problems arise on the photosensitive substrate as well. A pattern layer formed on the photosensitive substrate surface and/or the top and bottom surfaces of the resist layer correspond to the top and bottom surfaces of the mask. Although explanation has been made using the LIA system as an example, all the alignment systems that utilize laser light scattered or diffracted by the alignment mark, including the LIA system and the LSA system and the like, have the same problems.

SUMMARY OF THE INVENTION

The present invention was conceived in order to overcome these problems inherent in the conventional art, and aims to provide a projection exposure apparatus that can maintain accurate alignment performance by adopting an alignment system that utilizes laser light as the alignment light.

To achieve the object mentioned above, according to the invention, a means for controlling the coherence length of the laser light is provided in the alignment system. Laser light having a short coherence length, such as a multi-mode laser to beam, is used as the alignment light. In this arrangement, unnecessary interference is eliminated, and influences on the laser light source from the temperature changes, the returning light, or the like are reduced, thereby stabilizing detection signals detected by the alignment system.

The projection exposure apparatus of the invention includes a projection exposure apparatus that has a projection optical system for projecting a pattern formed on the mask onto a photosensitive substrate, and an alignment system for aligning the mask and the photosensitive substrate. The alignment system includes a laser light source for generating laser light, and structure controlling the coherence length of the laser light. The present invention is efficient particularly when the laser light source is a semiconductor laser. According to the present invention, the coherence length of the laser light from the semiconductor laser is controlled by a high-speed switching circuit that turns the semiconductor laser oscillation on and off.

The present invention is particularly efficient when it is applied to alignment systems having a laser light source, an illumination mechanism that guides first and second laser beams emitted from the laser light source along two different paths onto a mask and/or a grid-shaped alignment mark formed on the photosensitive substrate, and a detection mechanism that detects the interference signals of the diffracted light of the first and second laser beams generated by the grid-shaped alignment mark.

Laser light generated by inductive discharge is coherent light whose waveform has a constant phase and is spatially preserved for a long period. Since ordinary light generated by natural emission, such as light emitted from an incandescent lamp, is not coherent light, it hardly interferes. Coherence length (coherence distance) is often used to represent the order of interference of the laser light. The coherence length is proportional to the square of the central wavelength and inversely proportional to the amplitude. If the coherence length is long, two light waves are likely to interfere with each other. In order to elongate the coherence length with constant wavelength, monochromatic single-mode oscillation with a small amplitude is performed. Conversely, if the coherence length is short, it becomes difficult for two light waves to interfere with each other. In order to shorten the coherence length, multi-mode oscillation with a wide range of oscillation wavelength is performed as multi-mode oscillation does not cause the mode hop phenomena and therefore, does not make the oscillation wavelength unstable.

As the driving current of the semiconductor increases, laser oscillation starts when the driving current reaches a certain level $I_s$, as shown in FIG. 6, and light is output. In the region beyond the laser oscillation starting current $I_s$, the light output is proportional to the excitation current of the semiconductor laser. On the other hand, the oscillation mode of the semiconductor laser has high order of dependence on the light output and changes as the light output changes as shown in FIG. 7. According to the example in FIG. 7, the semiconductor laser oscillates in the multi-mode until the light output reaches 1 mW. However, it oscillates in the single-mode when the light output becomes 5 mW. As shown in this example, the semiconductor laser usually oscillates in the single-mode and is accompanied with the mode hop phenomena, in which the laser oscillation wavelength irregularly oscillates as time passes.

Semiconductor lasers usually oscillate in the multi-mode during the first several nanoseconds after the beginning of the laser oscillation. Hence, by attaching a high-speed switching circuit to the driving circuit of the semiconductor laser and turning on and off the driving current at high speed, multi-mode oscillation is achieved, as shown in FIG. 8. Since any two consecutive modes of multi-mode oscillation have an equal frequency difference and a constant phase relation, the light level of the semiconductor laser that illuminates the alignment mark is kept constant. In addition, the coherence length, which determines the coherence between the multi-superimposed reflected/diffracted light and the 0-th order diffracted light, is shortened. As a result, unnecessary interference is eliminated, and the detection signal of the alignment system is kept stable.

BRIEF DESCRIPTION OF THE DRAWINGS

These and other aspects and advantages of the present invention will be described in detail with reference to the accompanying drawings, in which.

DETAILED DESCRIPTION OF PREFERRED EMBODIMENTS

A preferred embodiment of the present invention will now be described with reference to the accompanied drawings.

Figure 1:
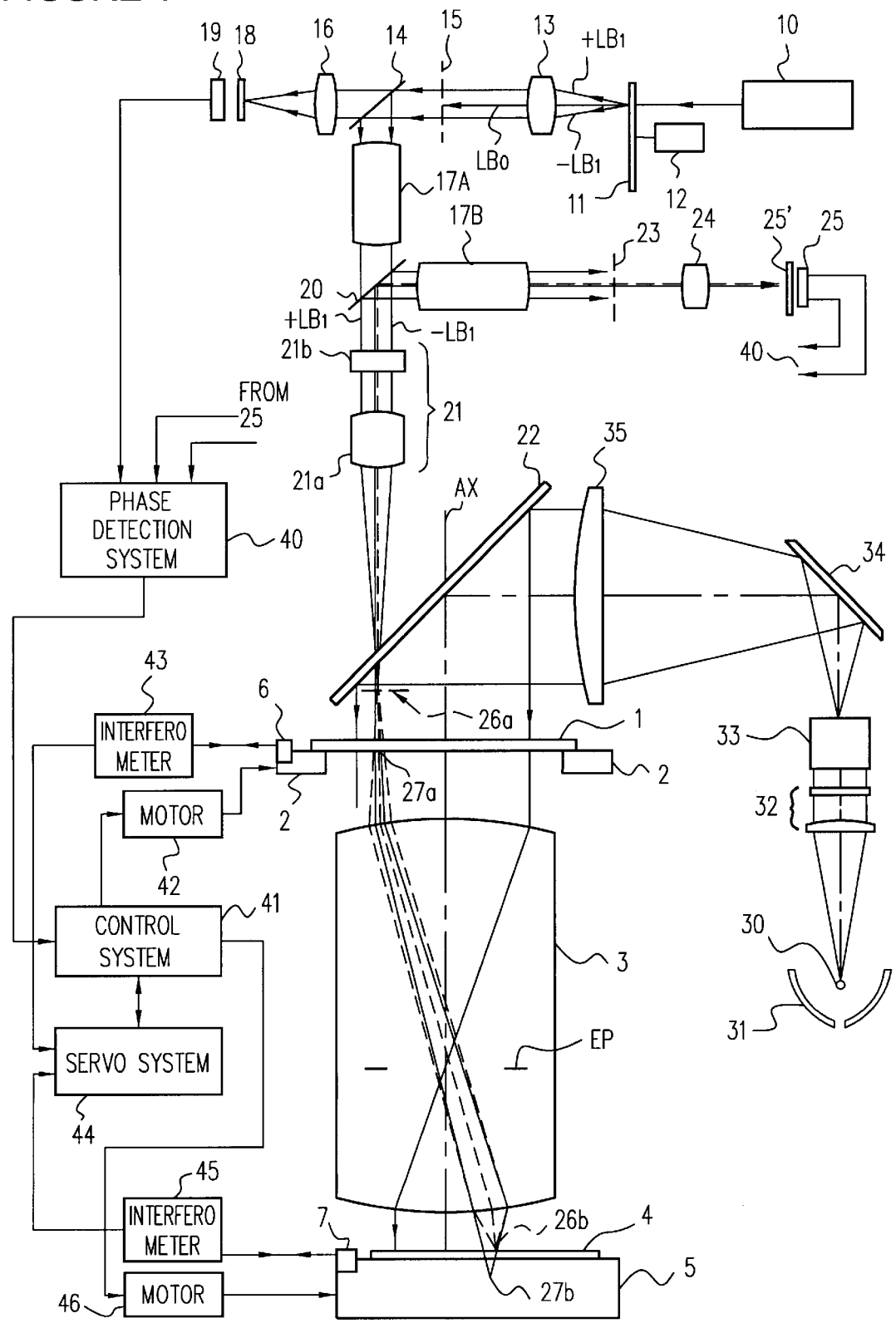
FIG. 1 illustrates an exemplary projection optical system according to an embodiment of the invention.

FIG. 1 illustrates an exemplary projection exposure apparatus equipped with an LIA heterodyne type alignment system according to the present invention. A mask 1, in which a prescribed pattern and a diffraction-grid alignment mark (reticle mark) are formed, is held on a mask stage 2a, which is movable in two dimensions. The pattern on the mask 1 is formed on a photosensitive substrate 4 under the exposure light by the projection optical system 3, which is telecentric on both sides. The chromatic aberration of the projection optical system 3 is corrected with respect to the exposure light. The mask 1 and the photosensitive substrate 4 are installed so that they become conjugate to each other with respect to the exposure light. A diffraction-grid alignment mark similar to the one formed on the mask 1 is formed on the photosensitive substrate 4 as well.

The photosensitive substrate 4 is held on a substrate stage 5, which two-dimensionally moves in a step-and-repeat manner. Once the exposure of the mask pattern corresponding to one shot field on the photosensitive substrate 4 is completed, the photosensitive substrate 4 is shifted to the next shot position. A mobile mirror 6 is fixed the mask stage 2 to reflect the laser beam of a laser interferometer 43, which detects the position of the mask 1 in the x-direction and y-direction on the horizontal plane and in the rotational ($\theta$) direction. A second mobile mirror 7 is fixed on the substrate stage 5 to reflect the laser beam of a second laser interferometer 45, which detects the position of the photosensitive substrate 4 in the x-direction and y-direction on the horizontal plane of the photosensitive substrate 4. A driving motor 42 shifts the mask stage 2 along the x, y and $\theta$ directions, and a driving motor 46 two-dimensionally moves the substrate stage 5.

An exposure illumination system comprises a mercury lamp 30, an elliptic mirror 31, an input lens group 32 including a condenser lens and an interference filter, an optical integrator 33, a mirror 34, a main condenser lens 35, and a dichroic mirror 22. The dichroic mirror 22 is installed above the mask 1 at 45 degrees with respect to the mask 1. The dichroic mirror 22 reflects the exposure light from the condenser lens 35 vertically downward and uniformly illuminates the mask 1. The reflectance of this dichroic mirror 22 with respect to the wavelength of the exposure light is over 90%, and the transmittance of the dichroic mirror 22 with respect to the alignment light is over 50%.

In the alignment system, alignment illumination light is emitted from a semiconductor laser light source 10. The alignment light passes through a radial grating 11, which includes a transmissive reference diffraction and having a radial shape, passes through a Fourier transform lens 13, and reaches a space filter 15 installed on the Fourier-plane of the Fourier transform lens 13.

Figure 2:
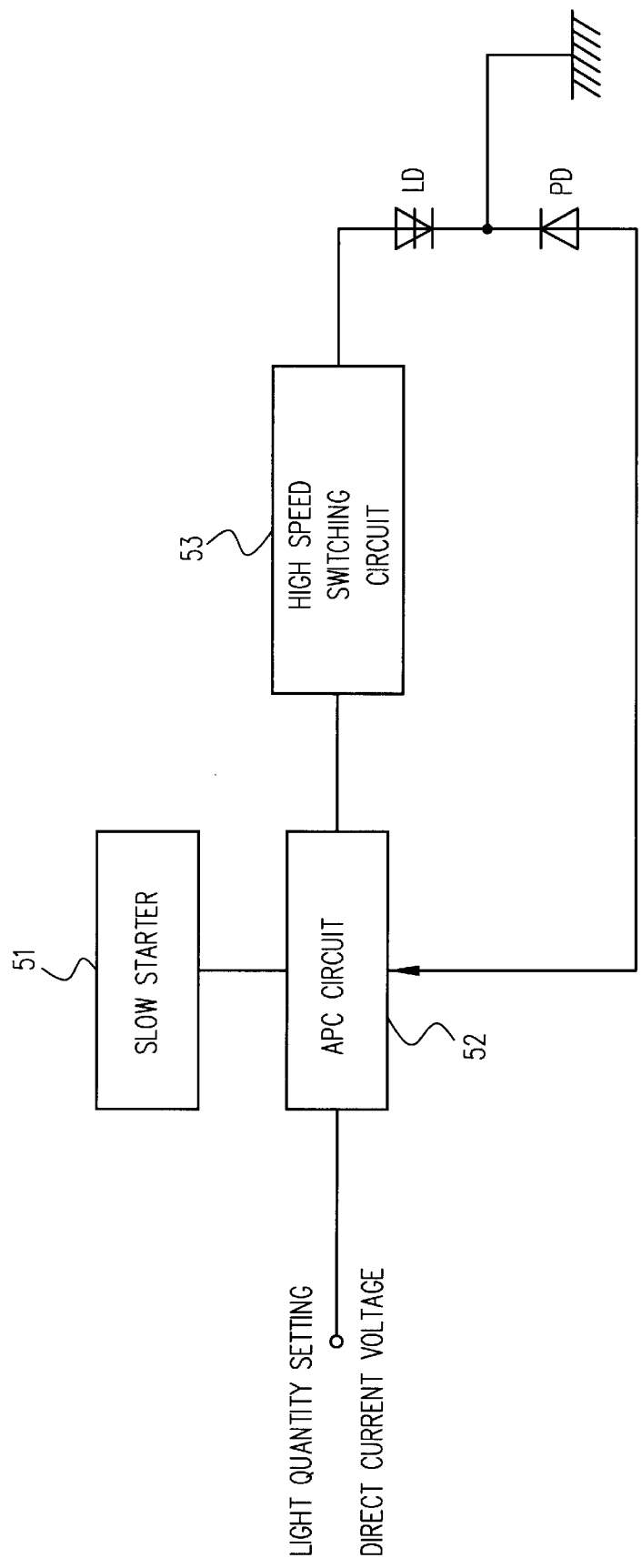
FIG. 2 illustrates a semiconductor laser driving circuit.
Figure 8:
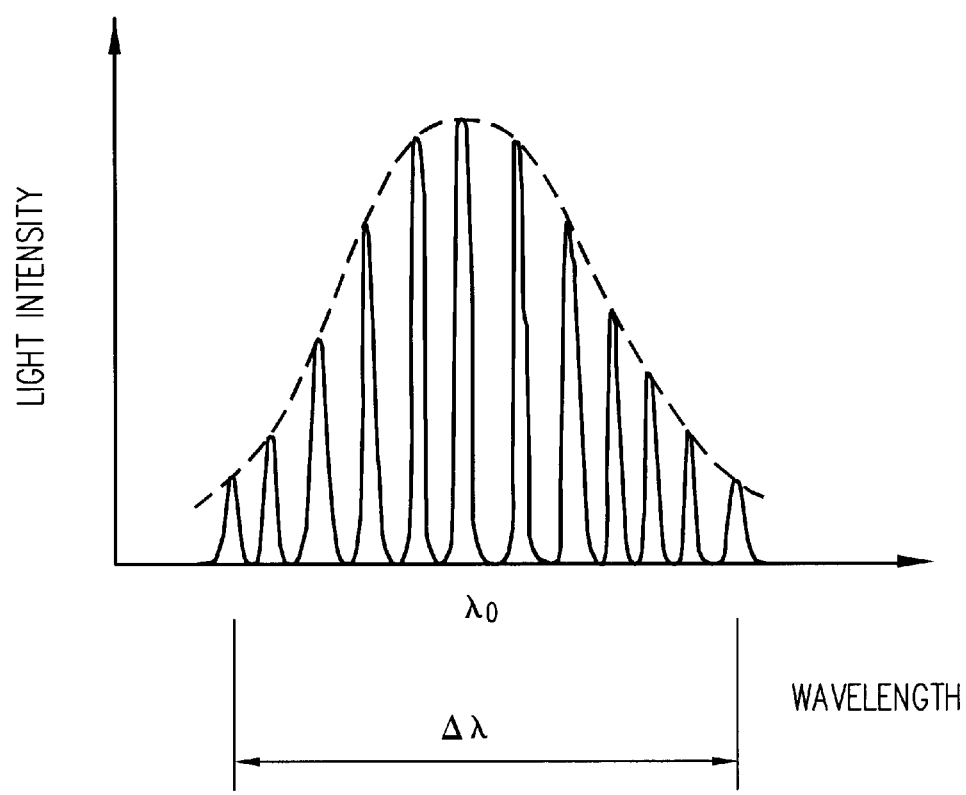
FIG. 8 illustrates a multi-mode oscillation mode of the semiconductor laser.
Figure 9:
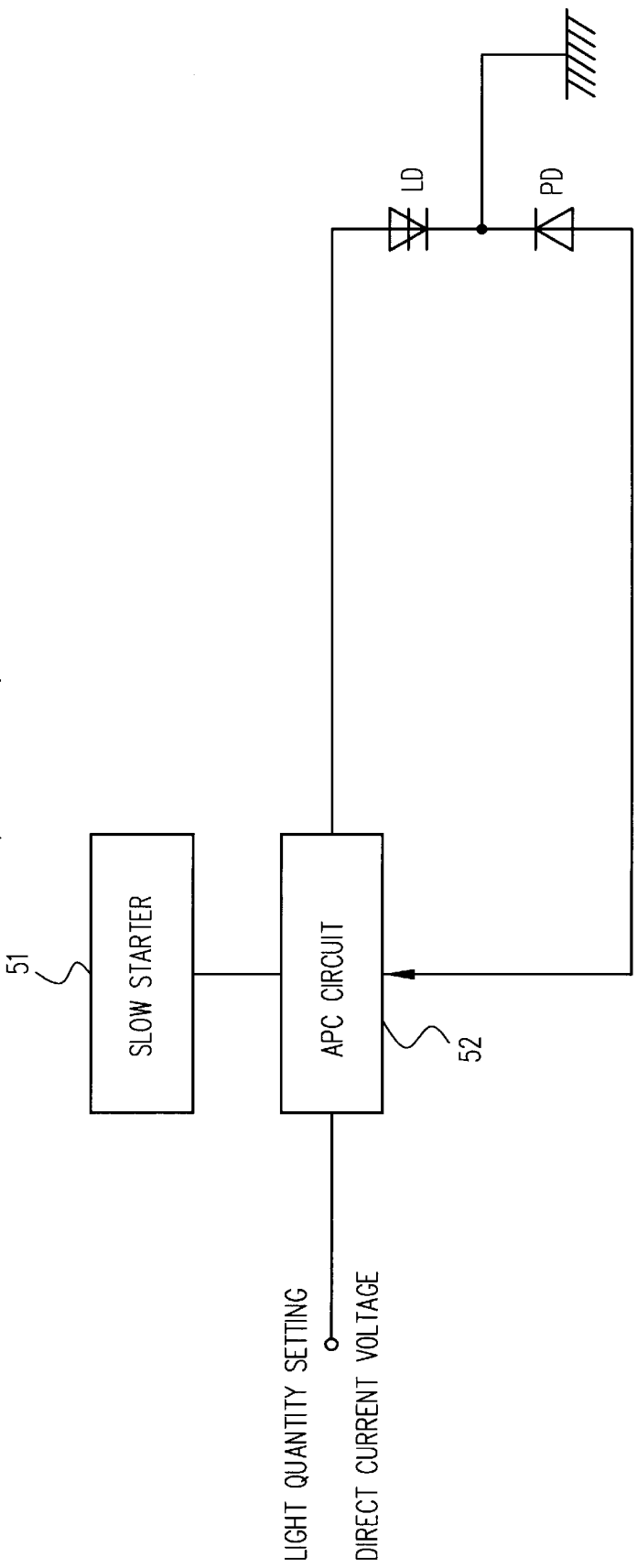
FIG. 9 is a block diagram of a conventional semiconductor laser driving circuit.
Figure 10:
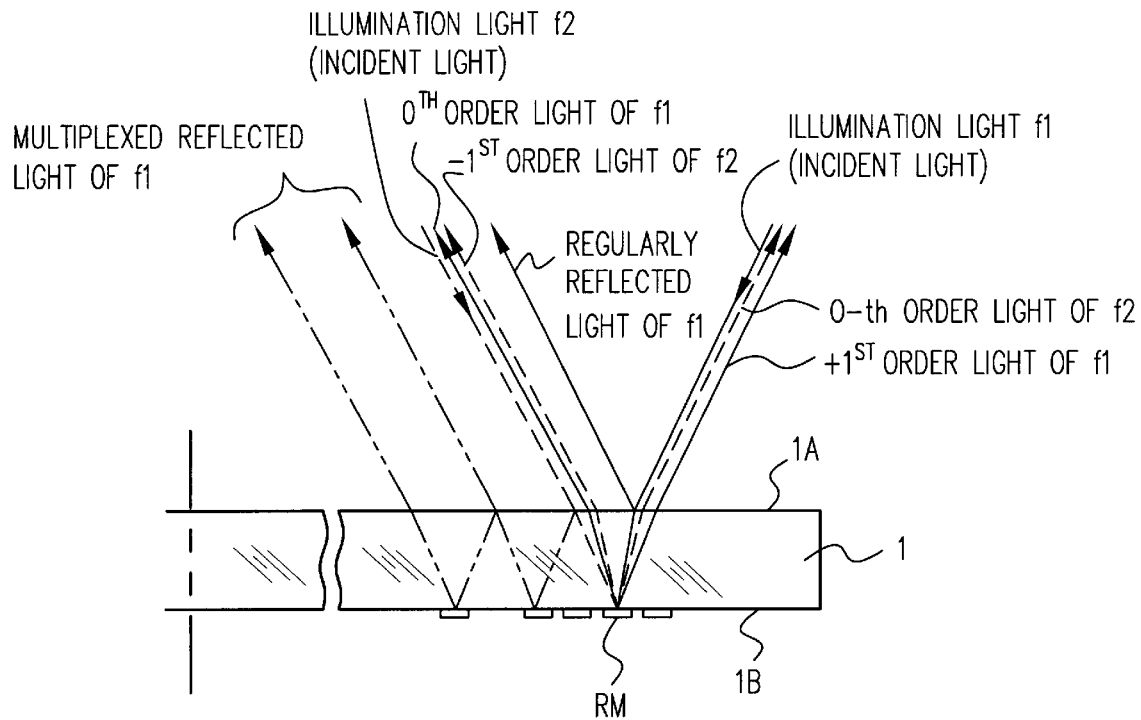
FIG. 10 illustrates the relation between the reticle mark formed on the mask and the alignment light.
Figure 11:
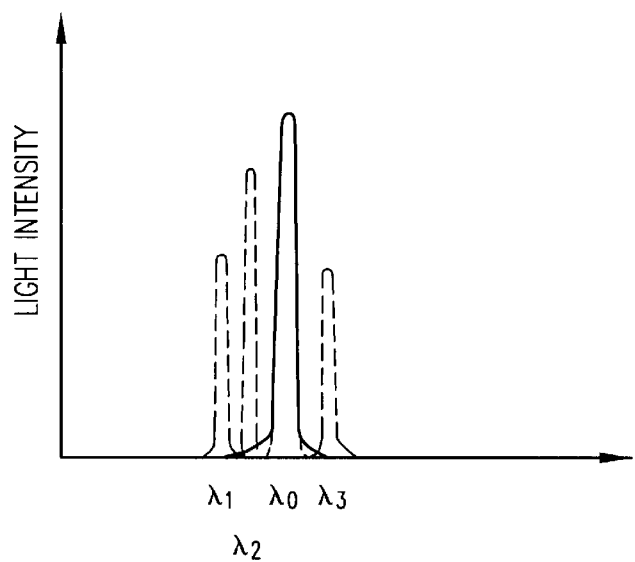
FIG. 11 illustrates the single oscillation mode of the semiconductor laser and the mode hop.

FIG. 2 illustrates the driving circuit of the semiconductor alignment laser 10. In FIG. 2, the slow-starter 51 protects the semiconductor laser LD from a surge (electric current instantaneously flows when the switch is turned on) of the direct current power source. The APC-circuit 52 monitors the light output of the semiconductor laser LD via the photodiode PD so that the light output of the semiconductor laser LD remains constant regardless of changes in the surrounding temperature. The APC-circuit 52 applies feedback control on the driving current. The high-speed switching circuit 53 turns on and off the set light-output at high speed by chopping the current supplied to the semiconductor laser via a switching transistor. In this circuit structure, mode synchronization is forcibly applied to the semiconductor laser LD by switching the driving current at a frequency close to the mode interval (by means of the high-speed switching circuit 53), thereby achieving multi-mode oscillation as shown in FIG. 8.

The motor 12 can rotate the radial grating 11 at almost constant angular speed. The laser light that enters the radial grating 11 is diffracted as the 0-th order light, ± first order light, ± second order light, and so on, each of which propagates at a different diffraction angle. FIG. 1 illustrates only the 0-th order light $LB_0$, the positive first order light $+LB_1$, and the negative first order light $-LB_2$. The principal light beams of the 0-th order light and ± first order light become parallel to each other by the refractive power of the lens system 13. They are separately distributed on a space filter 15 installed on the Fourier plane. The space filter 15 shields the 0-th order light, while allowing th± first order light to pass through. The ±first order light (which has passed through the space filter 15) is reflected by a beam splitter 14, then passes through a pupil-relay system 17, passes through a second beam splitter 20, and enters bifocal point optical system 21.

The bifocal point optical system 21 includes a pupil of the alignment system (i.e, a combination of a bifringent material 21b, which is installed in conjugation with the pupil EP of the projection optical system 3, and an objective 21a), and provides different power corresponding to the polarization components (P polarization and S polarization) of the ± first order light of the laser light. Here, it is assumed that the semiconductor laser 10 emits ortho-linearly polarized laser light. Hence, one polarized light (for example, P polarization) emitted from the bifocal point optical system 21 is focused on the focal point 26a above the mask 1, and the other polarized light (the S polarization) is focused on the focal point 27a on the pattern plane contained in the bottom surface of the mask 1. Furthermore, the other set of focal points of the bifocal point optical system 21 (i.e, the set of focal points conjugate with the set of focal points 26a and 27a and positioned on the side of the laser light source 10) lie on the same plane as the radial grating 11.

The distance along the optical axis between the two focal points 26a and 27a of the bifocal point optical system 21 corresponds to the amount of chromatic aberration on the mask 1 side of the projection optical system 3 at the wavelength of the alignment laser light. The plane containing this focal point 26a is conjugate with the image formation plane 26b, which coincides with the top surface of the photosensitive substrate 4 with respect to the projection optical system 3. Similarly, the plane containing the focal point 27a (the mask pattern plane) is conjugate with the image formation plane 27b, which coincides with the bottom surface of the photosensitive substrate 4 with respect to the projection optical system 3. The distance between the image formation plane 26b and the image formation plane 27b corresponds to the amount of chromatic aberration on the photosensitive substrate 4 side of the projection optical system 3 at the wavelength of the alignment laser light. If the separation distance between the image formation plane 26b and the image formation plane 27b is denoted by Dw, the separation distance between the image formation plane containing the focal point 26a and the image formation plane containing the focal point 27a is denoted by Dr, and the magnification power of the projection optical system 3 is denoted by 1/M, then the relation $Dr=M^2(Dw)$ is satisfied.

The ± first order light $LB_1$ of the alignment laser light (S polarization) forms an image on the reticle mark of the mask 1 from two directions at angles formed by the positive first order light $+LB_1$ and the negative first order light $-LB_1$ with respect to the plane containing the focal point 27a. The light reflected and diffracted by the reticle mark of the mask 1 passes through the dichroic mirror 22 and the bifocal-point optical system 21 and is reflected by the beam splitter 20. Then, the light passes through the pupil relay system 17B and the space filter 23 installed on the pupil conjugate plane (Fourier plane). The space filter 23 filters only the diffracted light that advances along the optical axis. The light then passes through the condenser lens 24 and reaches the photoelectric detector 25.

The light reflected and diffracted by the substrate mark on the photosensitive substrate 4 traces back the optical path it has followed via the projection optical system 3. The light transmits a transparent part of the mask 1, passes through the dichroic mirror 22, the bifocal-point optical system 21, the beam splitter 20, the pupil relay system 17B, the space filter 23 and the condenser lens 24, and reaches the photoelectric detector 25. The space filter 23 is installed at a position conjugate with the pupil plane of the alignment optical system, that is, a position that is substantially conjugate with the exit pupil of the projection optical system 3. The space filter 23 shields the regularly reflected light from the mask 1 or the photosensitive substrate 4 and transmits only the light that is diffracted vertically in the direction tangent to the surface of the space filter 23 to the mask 1 or the substrate mark of the photosensitive substrate 4. In addition, an aperture plate 25' is positioned in front of the photoelectric detector 25. The aperture plate 25' is conjugate with the mask 1 and the photosensitive substrate 4, respectively, via the lens 24a, the bifocal-point optical system 21, and the pupil relay system 17.

The photoelectric signal obtained from the photoelectric detector 25 is a sine-wave like alternating current signal whose frequency corresponds to the angular speed of the radial grating 1, because the mask 1 or the photosensitive substrate 4 is illuminated by the ± first order light $LB_1$ from two directions so that interference fringe generated by the ± first order light $LB_1$ will flow in the pitch direction on each of the diffraction grid marks.

The ± first order light coming from the radial grating 11 is transmitted through the beam splitter 14 and forms an image on a reference diffraction grid 18 via the inverse Fourier transform lens 16, which transforms the pupil (Fourier plane) into an image plane. The reference diffraction grid 18 is fixed on the device. The photoelectric detector 19 receives the diffracted light (or interference light) that has been transmitted through the reference diffraction grid 18 and outputs a sine-wave photoelectric signal. This photoelectric signal has a frequency proportional to the angular speed of the radial grating and serves as a reference signal.

The phase detection system 40 receives photoelectric signals from the photoelectric detectors 25 and 19 as input signals and detects the phase difference between the two signals. The detected phase difference corresponds to the relative phase displacement within the range of one half of the grid pitch (interval) of the alignment mark formed on the mask 1 and the photosensitive substrate 4. The control system 41 controls the driving motors 42 and 46 based on the position information obtained via the servo system 44 from the laser interferometers 43 and 45 and the detected information on the phase difference. In this way, the control system 41 aligns the relative positions of the mask 1 and the photosensitive substrate 4, respectively. Although FIG. 1 illustrates the two light beams $+LB_1$ and $-LB_1$ as if they cross within the plane of the paper, they are actually tilted from each other on a plane that is perpendicular to the paper and contains the optical axis AX of the projection optical system 3.

In this structure, the alignment mark can be detected even during the exposure process since the dichroic mirror 22, which is obliquely positioned above the mask 1, separates the exposure light and the alignment light. This means that the alignment mark is detected even when the alignment state of the mask 1 and the photosensitive substrate 4 deviates from the norm due to some external disturbances during the exposure. Moreover, positioning servo control for the mask stage 2 and the substrate stage 5 can be performed in a closed loop based on the phase difference information from the phase difference detector 40 even during the exposure operation.

Figure 3:
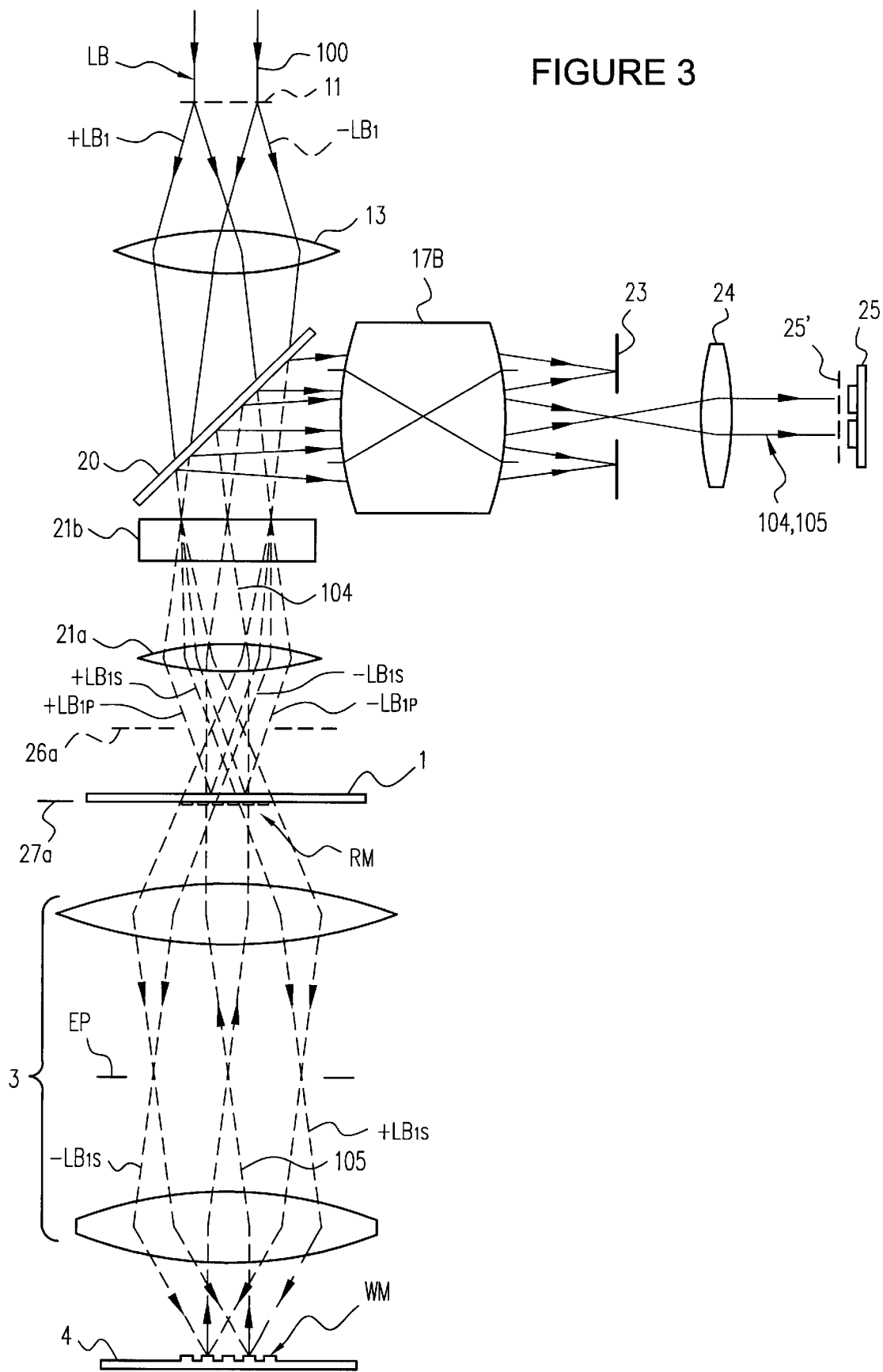
FIG. 3 illustrates the structure of the alignment system.

Next, explanation will be made on the detailed structure of the alignment system and the basic operation of the alignment process with reference to FIG. 3. In FIG. 3, the dichroic mirror 22, the space filter 15, the beam splitter 14 and the pupil relay system 17, which are shown in FIG. 1, are omitted for the purpose of simplifying the explanation. The same reference numbers denote the same elements as those in FIG. 1.

A substantially parallel laser light beam LB is emitted from the semiconductor laser 10 and strikes the radial grating (frequency sifter) 11. After this laser light beam LB is decomposed into P-polarization and S-polarization by the bifocal-point optical system 21, the P-polarization and the S-polarization converge at the focal points 26a and 27a. The polarization direction of the laser light beam LB is controlled so that the light intensity (the quantity of light) of the P-polarization and that of the S-polarization satisfy a prescribed ratio. The polarization direction of the laser light beam LB is usually controlled so that the quantity of light (of the S-polarization) supplied to the photosensitive substrate 4 will increase, because a greater amount of light that reaches the photosensitive substrate 4 is lost than the light that reaches the mask 1. To accomplish this, either the bifocal-point optical device 21 is rotated around the optical axis, or a λ/2 plate is inserted between the laser light source and the radial grating 11 and then rotated around the optical axis.

The ± first order light $LB_1$ (parallel light flux) from the radial grating 11 enters the telecentric pupil surface of the bifocal-point optical system 21 and converges on a spot inside the bifringent material 21b by the function of the lens system 13. The positive first order light $+LB_1$ is decomposed into P-polarization $+LB_{1P}$ and the S-polarization $+LB_{1S}$ by the polarizing component of the bifringent material 21b. The P-polarization $+LB_{1P}$ and the S-polarization $+LB_{1S}$ then become parallel light beams that are tilted by an angle determined by the diffraction angle with respect to the optical axis of the bifocal-point optical system 21, and the parallel light beams reach the mask 1.

Similarly, the negative first order light $-LB_1$ is decomposed into P-polarization $-LB_{1P}$ and S-polarization $-LB_{1S}$. The P-polarization $-LB_{1P}$ and S-polarization $-LB_{1S}$ become parallel light beams whose tilt angle is symmetric to that of the positive first order light ($+LB_{1P}$, $+LB_{1S}$) with respect to the optical axis of the objective 21a, and the parallel light beams reach the mask 1. Since the focal point 27a and the radial grating 11 are conjugate with respect to the P-polarization, the first order light $+LB_{1P}$ and $-LB_{1P}$ of the P-polarization become almost parallel light beams and form an image at the reticle mark RM as they cross the reticle mark RM. In FIG. 3, the grids of the reticle mark RM are arranged along the horizontal direction. The inclination directions of the first order light $+LB_{1P}$ and $-LB_{1P}$ with respect to their optical axes also lie on the page of FIG. 3.

Figure 4A:
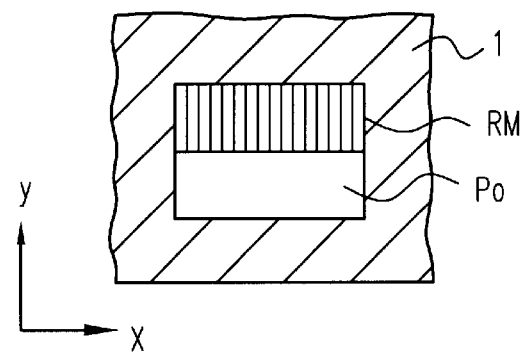
FIG. 4(a) is a top-view of an exemplary reticle mark.
Figure 4B:
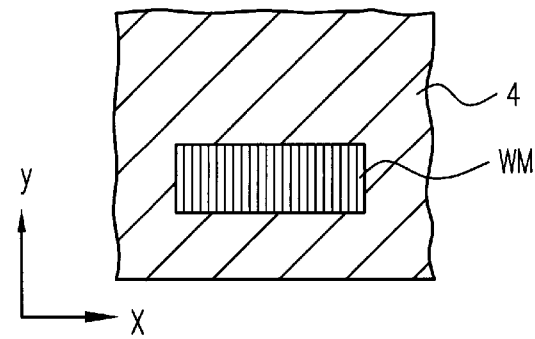
FIG. 4(b) is a top-view of an exemplary substrate mark.

As shown in FIG. 4(a), a reticle mark RM and a transparent window $P_0$ are formed on the mask 1. The first order light $+LB_{1P}$ and $-LB_{1P}$ both illuminate a portion on the mask 1 that covers the reticle mark and the window $P_0$. The reticle mark RM illustrated in FIG. 4(a) is used to detect a position along the x-direction. The substrate mark WM on the photosensitive substrate 4 is also used to detect a position along the x-direction as shown in FIG. 4(b). The substrate mark WM is set to be aligned at the position of the window $P_0$ of the mask 1 at the time of alignment (or exposure).

Each of the S-polarized first order light $+LB_{1S}$ and $-LB_{1S}$, which has emitted from the bifocal-point optical system 21 as substantially parallel flux, focuses (crosses) at the focal point 26a in the space between the objective 21a and the mask 1, and passes through the window $P_0$ of the mask 1. Each of the S-polarized first order light $+LB_{1S}$ and $-LB_{1S}$ converges as a spot light at the pupil EP of the projection optical system 3, and strikes the substrate mark WM of the photosensitive substrate 4 from a different direction so as to focus on the substrate mark WM. This occurs because the top surface of the photosensitive substrate 4 is conjugate with the radial grating 11 with respect to the S-polarization.

The substantially parallel S-polarized first order light beams $+LB_{1S}$ and $-LB_{1S}$ that exit from the projection optical system 3 are symmetrically tilted with respect to the grid direction of the substrate mark WM as they strike the photosensitive substrate 4. The angle formed by the first order light beams $+LB_{1S}$ and $-LB_{1S}$ of the S-polarization on the photosensitive substrate 4 is large, but does not exceed the exit side (substrate side) numerical aperture of the projection optical system 3. Note that the mask 1 and the photosensitive substrate 4 are positioned conjugate with respect to the radial grating 11, and therefore, if the laser light beam LB is a parallel light beam, then each of the light beams $+LB_{1P}$, $-LB_{1P}$, $+LB_{1S}$, and $-LB_{1S}$ is a parallel light beam.

Figure 5:
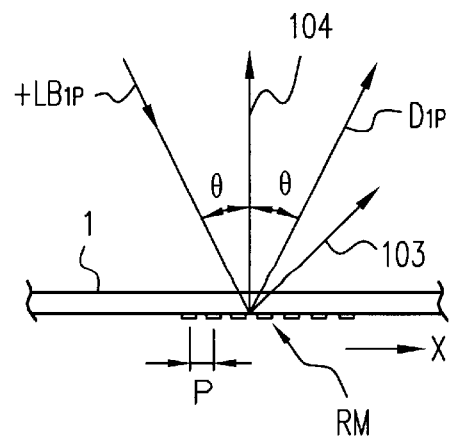
FIG. 5 illustrates the diffracted light generated from the reticle mark.
Figure 6:
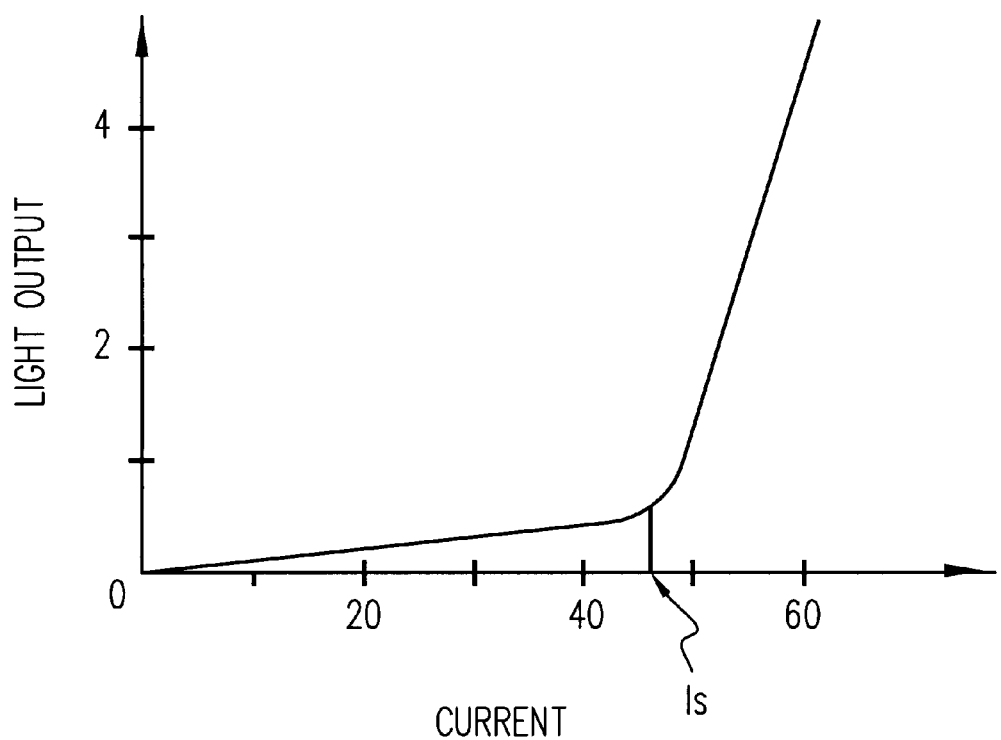
FIG. 6 shows the light output of the semiconductor laser as a function of the current.
Figure 7:
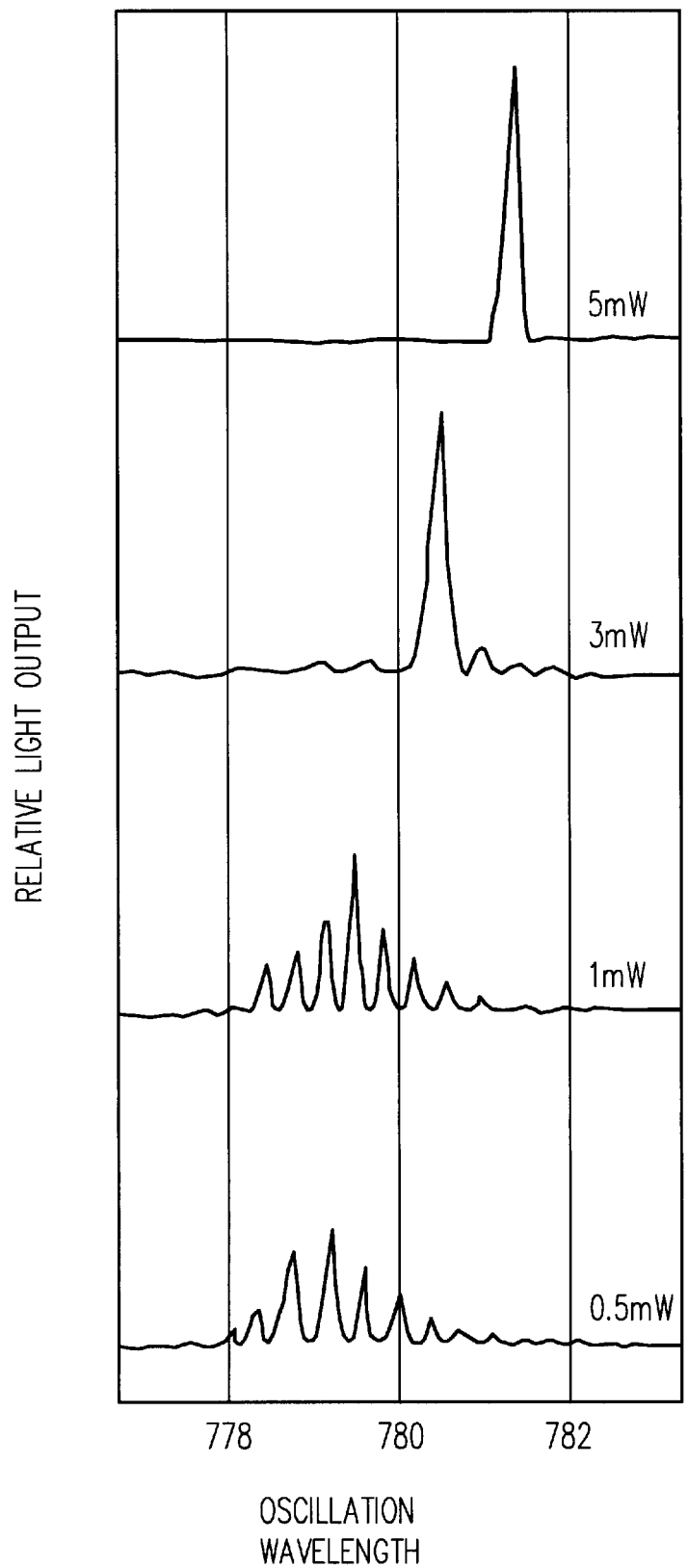
FIG. 7 illustrates the light output dependent on the oscillation frequency of the semiconductor laser.

Next, the behavior of the P-polarized first order light $+LB_{1P}$ and $-LB_{1P}$ with respect to the mask 1 will be described with reference to FIG. 5, which illustrates the reticle mark RM. It is assumed that the P-polarized first order light $+LB_{1P}$ strikes the reticle mark RM at an incident angle θ. In this case, the regularly reflected light $D_{1P}$ of the first order light $+LB_{1P}$ also forms the same angle θ with the mask. The fact that the light beam $+LB_{1P}$ enters the mask 1 at the angle θ implies that the light beam $-LB_{1P}$ enters the mask 1 at the angle θ from the opposite direction of the regular reflection light $D_{1P}$. If the grid pitch of the reticle mark is P, the wavelength of the laser light beam LB is δ, and an integer is n, then the pitch P and the angle θ are determined so that the following equation (1) is satisfied:

$$\sin\theta = (\lambda/P)n \quad (1)$$

If equation (1) is satisfied, diffracted light 104 of specific order, which is generated from the reticle mark RM by the illumination of the first order light $+LB_{1P}$ and $-LB_{1P}$, propagates along a direction perpendicular to the mask 1 (i.e, along the direction of the optical axis of the bifocal-point optical system 21). Of course, the other diffracted light 103 is also generated, which propagates along a direction different from that of the diffracted light 104.

The light beams $+LB_{1P}$ and $-LB_{1P}$ illuminate the reticle mark RM on the mask 1 from two directions as they cross the mask 1. Since the two light beams emitted from the same laser light source 10 are identically polarized, one dimensional contrast fringe (so called interference fringe) is generated on the reticle mark RM by the interference of the two light beams $+LB_{1P}$ and $-LB_{1P}$. Supposing that the radial grating 11 is at rest, this interference fringe is arranged along the grid arrangement direction of the reticle mark RM at a prescribed pitch. When the radial grating 11 is rotating, the interference fringe moves (flows) along the grid arrangement direction of the reticle mark RM. This is caused by the fact that the dark field image of the radial grating 11 by the first order light $+LB_1$ and $-LB_1$ forms an image on the reticle mark RM. Hence, the diffracted light 104 periodically repeats its contrast changes as the interference fringe scans the reticle mark RM. As a result, the signal from the photoelectric detector 25 becomes a sine-wave like alternating current signal corresponding to the period of the contrast changes.

The same thing as described above also applies to the relation between the substrate mark WM on the photosensitive substrate 4 and the S-polarized light beams $+LB_{1S}$ and $-LB_{1S}$. Diffracted light 105 is generated from the substrate mark WM. The diffracted light 105 propagates along the principal ray of the projection optical system 3 and reaches the photoelectric detector 25 via the window $P_0$ of the mask 1. The S-polarized light beams $+LB_{1S}$ and $-LB_{1S}$ emitted from the bifocal-point optical system 21 form an image at the focal point 26a as they cross; however, they are greatly defocused when they reach the reticle mark RM of the mask 1 and the window $P_0$.

Figure 4C:
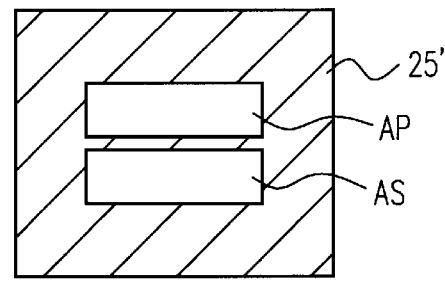
FIG. 4(c) is a top-view of the aperture plate inside the alignment system.

So far, the photoelectric detector 25 has been described positioned so as to be conjugate with the reticle mark RM and the substrate mark WM via the bifocal-point optical system 21. In practice, however, the aperture plate 25' shown in FIG. 4(c) is positioned conjugate with the reticle mark RM and the substrate mark WM, respectively, as shown in FIG. 3, so that the diffracted light beams 104 and 105, which have been transmitted through the apertures $A_p$ and $A_s$ of the aperture plate 25', can be photoelectrically detected. Here, the aperture $A_p$ picks up, for example, a diffraction image from the reticle mark RM due to the diffracted light 104, and the aperture $A_s$ picks up a diffraction image from the substrate mark WM due to the diffracted light 105. Accordingly, by separately installing the photoelectric detectors 25 so that the light-receiving surfaces of the photoelectric detectors 25 are positioned behind the apertures $A_p$ and $A_s$, respectively, detection of the position of the mask 1 using the reticle mark RM, and detection of the position of the photosensitive substrate 4 using the substrate mark WM, can be independently conducted.

The image of the reticle mark RM illuminated by the P-polarized light beams $+LB_{1P}$ and $-LB_{1P}$ is formed on the aperture $A_p$. At the same time, the reflected diffracted light of the S-polarized light beams $+LB_{1S}$ and $-LB_{1S}$ also enter the aperture $A_0$ as background noise. To reduce the background noise, a polarizer that transmits the P-polarized light is inserted in the aperture $A_p$. Similarly, a polarizer that transmits the S-polarized light is inserted in the aperture $A_s$. In this way, cross-talk caused by mixture of the light from the photosensitive substrate 4 and the light from the mask 1 can be adequately reduced at each of the two photoelectric detectors 25.

The photoelectric signal of the diffracted light 104, which is obtained through the aperture $A_p$ when the radial grating 11 is at rest, will be analyzed. If $n=\pm 1$ in equation (1), it is found that the grid pitch P is related to the reference grating pitch of the radial grating 11 in the form of image formation magnification power via the lens system 13, the pupil relay system 17A and the bifocal-point optical system 21. Similarly, the grid pitch of the substrate mark WM is also related to the grid pitch of the reticle mark RM and the image formation magnification power of the projection optical system 3. The amplitude $VR^+$ of the reflected light generated by the light beam $+LB_{1P}$ that enters the reticle mark RM is given by the following equation (2), while the amplitude $VR^-$ of the reflected light generated by the light beam $LB_{1P}$ that enters the reticle mark RM, is given by the following equation (3):

$$VR^+ = a\,\sin(\phi + 2\pi x/P) \qquad (2)$$

$$VR^- = a'\sin(\phi - 2\pi x/P) \qquad (3)$$

where P denotes the grid pitch of the reticle mark RM, and x denotes the displacement position of the grid arrangement direction of the reticle mark RM. Chances in the photoelectric signal of the diffracted light 104 (amplitude of the diffracted light 104) are represented by the following equation (4) since the two diffracted light beams $VR^+$ and $VR^-$ interfere with each other as they are photoelectrically detected:

$$|VR^+ + VR^-|^2 = a^2 + a'^2 + 2aa'\cos(4\pi x/P) \qquad (4)$$

Here, $a^2 + a'^2$ represents the bias (direct current component) of the signal, and $2aa'$ represents the amplitude of the change in the signal. As can be seen from equation (4), the photoelectric signal exhibits sine-wave chances as the radial grating 11 and the reticle mark RM are displaced relative to the arid arrangement direction. The signal amplitude changes by one period whenever the relative displacement amount x becomes P/2 (½ of the grid pitch of the reticle mark RM). On the other hand, exactly the same thing happens to the diffracted light 105 from the substrate mark WM, which is expressed by equation (4).

The alignment procedure is completed by shifting either the mask 1 or the photosensitive substrate 4 so that the phase relations of these two photoelectric signals coincide. However, since each of these signals is sine-wave like as illustrated by equation (4) and the detectable phase difference lies between −180 degrees and +180 degrees, the mask 1 and the photosensitive substrate 4 need to be pre-aligned within the error range less than the grid pitch P of the reticle mark RM and the substrate mark. Hence, when the radial grating 11 is at rest, the amplitude level of the obtainable photoelectric signal changes like a sine wave only by shifting either the mask 1 or the photosensitive substrate 4.

When the radial grating 11 is rotating, the diffracted light 104 and 105 become periodic contrast information. As a result, the obtainable photoelectric signal becomes a sine-wave alternating current signal even if either the mask 1 or the photosensitive substrate 4 is at rest. Hence, in this case, the phase difference detector 40 detects the phase difference Nr between the photoelectric signal (sinewave alternating current signal) from the photoelectric detector 19 shown in FIG. 1 as a reference signal and the photoelectric signal of the diffracted light 104 from the reticle mark AM (sine-wave alternating current signal). Similarly, the phase difference detector 40 detects the phase difference Nw between the photoelectric signal of the diffracted light 104 from the substrate mark WM and the reference signal. Thus, once the difference between the phase differences Nr and Nw is obtained, the displacement amount of the mask 1 and the photosensitive substrate 4 along the x-direction can be obtained.

According to this detection method, the position displacement of the mask 1 and the photosensitive substrate 4 can be detected with high resolution power even when they are at rest as long as they stay within an acceptable range of the positioning error, which is within ½ of the grid pitch P. Hence, closed-loop position-servo control can be applied so that micro-displacement will not arise while the pattern of the mask 1 is exposed onto the photoresist of the photosensitive substrate 4. With this detection method, the mask 1 and/or the photosensitive substrate 4 are shifted so that $\phi r - \phi w$ becomes zero (or a prescribed value) and so that the alignment is completed, and then servo-lock is applied at the alignment position so that the mask 1 and the photosensitive substrate 4 will not move relative to each other.

According to this example, the substrate stage 5 is shifted to each of the shot fields on the photosensitive substrate 4 based on the values measured by the interference system 45 during the step-and-repeat type exposure process. Once the substrate mark WM is positioned in the illumination field of the two light beams $+LB_{1S}$ and $-LB_{1S}$ within the acceptable error range (i.e., within ½ of the grid pitch P), servo-control is applied to the mask stage 2 or the substrate 5 based only on the information from the phase detection system 40. In this case, the DC motor can be used to mobilize the mask stage 2 and/or the substrate stage 5, generate the analog voltage corresponding to the phase difference $\phi r - \phi w$ via a D/A converter and the like, and directly impress this analog voltage to the servo circuit as the deviation voltage. This servo control is continued until the exposure of the shot field is completed.

The frequency of each of the photoelectric signals emitted from the photoelectric detectors 19 and 25 is proportional to the angular speed of the radial grating 11. Considering the response performance of the photoelectric detectors 19 and 25, the frequencies of the photoelectric signals emitted from the photoelectric detectors 19 and 25 should preferably be in the range of about 1 kHz through 10 kHz. Of course, the signal frequencies may be increased by using high-speed response photoelectric detectors for 19 and 25, thereby detecting the mark positions through the phase difference detector at a higher resolution. Although, in the embodiment described above, a radial grating is used to generate diffracted light from an incident laser beam, the present invention is not limited to this. For example, an acousto-optic modulator can be used to generate diffracted light. A brief explanation will be made on the example in which the acousto-optic modulator is used.

Figure 12:
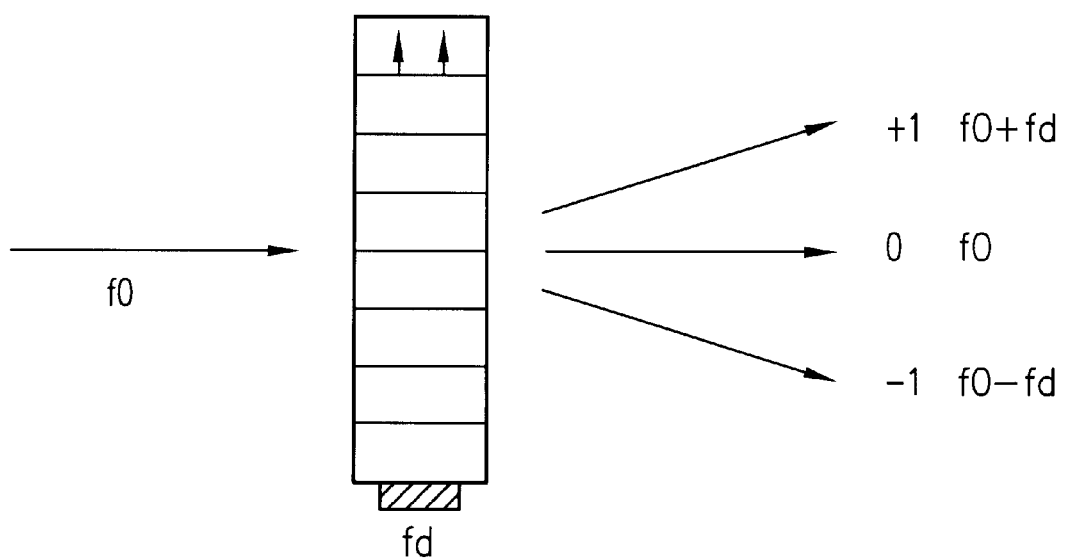
FIG. 12 shows how the incident laser beam is diffracted by the acoustoopc modulator.

In an acousto-optic modulator, an electrostriction device is formed at one end of a glass plate, and high-frequency vibration is generated to produce compressional waves traveling through the glass. The incident laser beam is refracted by the glass in different ways due to the different wave densities of the compressional waves traveling through the glass. This has the same diffraction effect as the radial grating. FIG. 12 illustrates how the incident laser beam is diffracted by the acousto-optic modulator.

If the frequency of the light that strikes the acousto-optic modulator is f0, and if the drive frequency of that incident light is fd, then the frequency of the positive first-order diffracted light becomes f0+fd because of the Doppler effect. However, the frequency of the negative first-order diffracted light is modulated to f0−fd. In the aforementioned LIA system, two acousto-optic modulators are driven at different frequencies (for example, at 80 MHz and 79.975 MHz), and the positive first-order diffracted light at the respective frequencies are used to obtain a signal having a frequency difference of 25 KHz.

According to this embodiment, unnecessary interference that occurs due to multiplexed reflected/diffracted light on the mask 1 and/or the photosensitive substrate 4, which was not avoided in the conventional art, is avoided, thereby stabilizing the signal in an LIA heterodyne system. Moreover, by using multi-mode oscillation laser light having a short coherent length, so-called mode hop can be prevented, which is a phenomena in which the oscillation mode jumps due to temperature changes in the semiconductor laser, which is oscillated in the single mode, or returning light. As a consequence, the interference conditions of the diffracted light from the reticle mark or the substrate mark become constant, thereby producing stable alignment signals and improving alignment accuracy.

Although the invention has been described using a projection optical apparatus equipped with an LIA heterodyne alignment system as an example, this invention can be equally applied to other types of alignment systems, such as an LIA homodyne system method, which employs laser light as the alignment light, and which performs alignment using the reflected light, scattered light and diffracted light from the alignment mark.

According to the present invention, unwanted interference that occurs due to the multiplexed reflected/diffracted light on the mask or the photosensitive substrate can be reduced, and mode hop of the semiconductor laser can be avoided. As a result, stable alignment signals are obtained and alignment accuracy is improved.

While the invention has been described in connection with what is presently considered to be the most practical and preferred embodiments, it is to be understood that the invention is not to be limited to the disclosed embodiments, but on the contrary, is intended to cover various modifications and equivalent arrangements included within the spirit and scope of the appended claims.

What is claimed is:

1. An alignment apparatus that detects an alignment mark formed on an object comprising:

a laser light source that emits a laser light along a laser light path;

a control unit that controls a coherence length of the laser light to a predetermined coherence length which eliminated interference produced at the alignment mark by multiplexed reflected light of the laser light generated by illuminating the object using the laser light; and a detector that detects a mark light generated from the alignment mark, the mark light is generated by illuminating the alignment mark using the laser light having the predetermined coherence length.

2. The apparatus as claimed in claim 1, wherein the laser light source is a semiconductor laser.

3. The apparatus as claimed in claim 2, wherein the control unit comprises a high-speed switching circuit coupled with the semiconductor laser, the control unit switching an oscillation of the semiconductor laser at a high speed.

4. The apparatus as claimed in claim 3, wherein the laser light source generates first and second laser beams, the apparatus further comprising:

an illumination mechanism operatively communicating with the laser light source, the illumination mechanism guiding the first and second laser beams along different light paths onto a grid-shaped alignment mark formed on at least one of the mask and the photosensitive substrate, the grid-shaped alignment mark generating diffracted light in a diffracted light path; and a detector disposed in the diffracted light path, the detector detecting interference signals representing interference of the diffracted light of the first and second laser beams.

5. The apparatus as claimed in claim 2, wherein the laser light source generates first and second laser beams, the apparatus further comprising:

an illumination mechanism operatively communicating with the laser light source, the illumination mechanism guiding the first and second laser beams along different light paths onto a grid-shaped alignment mark formed on at least one of the mask and the photosensitive substrate, the grid-shaped alignment mark generating diffracted light in a diffracted light path; and a detector disposed in the diffracted light path, the detector detecting interference signals representing interference of the diffracted light of the first and second laser beams.

6. The apparatus as claimed in claim 1, wherein the laser light source generates first and second laser beams, the apparatus further comprising:

an illumination mechanism operatively communicating with the laser light source, the illumination mechanism guiding the first and second laser beams along different light paths onto a grid-shaped alignment mark formed on at least one of the mask and the photosensitive substrate, the grid-shaped alignment mark generating diffracted light in a diffracted light path; and a detector disposed in the diffracted light path, the detector detecting interference signals representing interference of the diffracted light of the first and second laser beams.

7. The apparatus as claimed in claim 1, wherein the laser light source is a multi-mode laser beam light source.

8. The apparatus as claimed in claim 7, wherein the control unit comprises structure that performs multi-mode oscillation with a wide range wavelength.

9. The apparatus as claimed in claim 8, wherein the structure that performs multi-mode oscillation comprises a driving circuit of the laser light source, the driving circuit including a photodiode, an APC circuit communicating with the photodiode and monitoring a light output of the laser light source via the photodiode, and a high-speed switching circuit coupled with the APC circuit, the high-speed switching circuit turning on and off the light output at high speed.

10. The apparatus as claimed in claim 1, further comprising a radial grating disposed adjacent the laser light source in the laser light path, the radial grating having a transmissive reference diffraction grid that diffracts the laser light generated by the laser light source into diffracted light beams.

11. The apparatus as claimed in claim 10, further comprising:
- a lens system disposed in the laser light path downstream of the radial grating, the lens system having a refractive power that converts the diffracted light beams into parallel light beams;
- a first space filter disposed in the laser light path downstream of the lens system; and
- a bifocal point optical system disposed in the laser light path downstream of the space filter, the bifocal point optical system providing a different power to the parallel light beams in accordance with polarization components of the parallel light beams.

12. The apparatus as claimed in claim 11, further comprising:
- at least one grid-shaped alignment mark formed on a corresponding at least one of the mask and the photosensitive substrate, the grid shaped alignment mark reflecting and diffracting the parallel light beams into mark diffracted beams along a reflected light path;
- a second space filter disposed in the reflected light path;
- a condenser lens disposed in the reflected light path downstream from the second space filter; and
- a first photoelectric detector disposed in the reflected light path downstream from the condenser lens, the first photoelectric detector receiving the mark diffracted beams and generating a reflected beam signal corresponding to the mark diffracted beams.

13. The apparatus as claimed in claim 12, further comprising:
- a second lens system disposed in the laser light path, the second lens system transforming the parallel light beams into an image plane;
- a reference diffraction grid disposed in the laser light path downstream from the second lens system, the reference diffraction grid diffracting the parallel light beams into reference diffracted beams;
- a second photoelectric detector disposed in the laser light path downstream from the reference diffraction grid, the second photoelectric detector receiving the reference diffracted beams and generating a laser light signal corresponding to the reference diffracted beams; and
- a phase detection system operatively communicating with the first photoelectric detector and the second photoelectric detector, the phase detection system detecting a phase difference between the reflected beam signal and the laser light signal.

14. An alignment method for detecting an alignment mark formed on an object, the method comprising:
(a) controlling a coherence length of the laser light to a predetermined coherence length which eliminates interference produced at the alignment mark by multiplexed reflected light of the laser light generated by illuminating the object using the laser light; and
(b) detecting a mark light generated from the alignment mark, the mark light is generated by illuminating the alignment mark using the laser light having the predetermined coherence length.

15. The method as claimed in claim 14, wherein step (b) comprises:
(b-1) generating first and second laser beams with the laser light having the coherence length controlled by the control unit,
(b-2) guiding the first and second laser beams along different optical paths to an alignment mark, the alignment mark converting the first and second laser beams into diffracted light beams; and
(b-3) detecting interference signals representing interference of the diffracted light beams.

16. The method as claimed in claim 15, wherein step (b) is further practiced by splitting with a beam splitter the first and second laser beams, a first portion of the laser beams following different split paths and a second portion of the laser beams following the different light paths, the method further comprising guiding the first portion laser beams along the different split paths to a reference diffraction grid, the reference diffraction grid transforming the first portion laser beams into reference diffracted beams, wherein step (b-3) comprises detecting interference signals representing interference of the reference diffracted beams.

17. The method as claimed in claim 16, wherein step (b) further comprises (b-4) detecting a phase difference between the interference signals representing interference of the diffracted light beams and the interference signals representing interference of the reference diffracted beams, and detecting a position of the object based on the phase difference.

18. The method as claimed in claim 17, wherein step (b-3) comprises controlling a position of at least one of the mask and the photosensitive substrate based on the phase difference detected in step (b-4).

19. An alignment apparatus that detects an alignment mark formed on an object, the alignment apparatus comprising:
- a beam generator that generates a light beam irradiated on the alignment mark;
- a detector that detects the beam via the alignment mark and generates a signal according to the detected beam; and
- a control unit electrically connected with the beam generator, the control unit controlling an interference condition of the beam for stabilizing the signal.

20. The alignment apparatus as claimed in claim 19, wherein the beam generator is a multi-mode beam generator, and wherein the controller controls the interference condition of the beam for stabilizing the signal by oscillating the beam generator in the multi-mode.

21. The alignment apparatus as claimed in claim 20, wherein a range wavelength width of the beam generated by the beam generator through multi-mode oscillation of the beam generator is set to a range where interference occurs.

22. The alignment device as claimed in claim 20, wherein the beam generator is a semiconductor laser device, and wherein the controller includes a high-speed switching device that turns on/off current supplied to the semiconductor laser device.

23. The alignment apparatus as claimed in claim 22, wherein the semiconductor laser device generates first and second laser beams, and wherein the semiconductor laser irradiates the alignment mark from different directions by the first and second laser beams, the detector generating said signal according to interference between the first laser beam and the second laser beam via the alignment mark.

24. An alignment method for detecting an alignment mark formed on an object, the method comprising:

(a) generating a beam irradiated to the alignment mark;

(b) detecting the beam via the alignment mark;

(c) generating a signal according to the detected beam;

(d) aligning the substrate according to the signal; and (e) controlling an interference condition of the alignment beam for stabilizing the signal.

25. The method as claimed in claim 24, wherein stop (e) comprises obtaining the beam by multi-mode oscillation.

26. The method as claimed in claim 25, wherein a range of the beam generated by the multi-mode oscillation is set to the range where interference occurs.

27. The method as claimed in claim 25, wherein the beam is generated with a semiconductor laser device, and wherein step (e) comprises high-speed switching of current supplied to the semiconductor laser device.

28. An alignment apparatus that detects an alignment mark formed on an object, the alignment apparatus comprising:

a semiconductor laser device that generates laser light irradiated to the alignment mark; and a controller that effects multi-mode oscillation of the semiconductor laser device.

29. The alignment device as claimed in claim 28, wherein the controller comprises a high-speed switching circuit that turns on/off a current supplied to the semiconductor laser device.

* * * * *